(12) United States Patent
Moriya

(10) Patent No.: US 8,067,994 B2
(45) Date of Patent: Nov. 29, 2011

(54) SURFACE MOUNT TYPE CRYSTAL OSCILLATOR

(75) Inventor: Kouichi Moriya, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 97 days.

(21) Appl. No.: 12/590,219

(22) Filed: Nov. 4, 2009

(65) Prior Publication Data

US 2010/0117745 A1   May 13, 2010

(30) Foreign Application Priority Data

Nov. 10, 2008   (JP) ................................. 2008-287270
Oct. 7, 2009   (JP) ................................. 2009-233089

(51) Int. Cl.
*H03B 5/12* (2006.01)
(52) U.S. Cl. .............. 331/158; 331/116 R; 331/116 FE; 331/108 C

(58) Field of Classification Search .................. 331/158, 331/116 R, 116 FE, 108 C
See application file for complete search history.

(56) References Cited

FOREIGN PATENT DOCUMENTS

JP        H09-83248        3/1997

*Primary Examiner* — Arnold Kinkead
(74) *Attorney, Agent, or Firm* — Scott D. Wofsy; Edwards Wildman Palmer LLP

(57) ABSTRACT

There is provided a configuration in which a lead-out electrode that extends out from an excitation electrode provided on a lower surface of a crystal piece facing an inner bottom surface of a container main body, is connected to a crystal terminal of an IC chip via a conducting path provided on the inner bottom surface of the container main body, and the conducting path is superimposed, in plan view, on the excitation electrode of the lower surface of the crystal piece, and the excitation electrode of the lower surface and the conducting path have the same electric potential, to thereby suppress the occurrence of stray capacity therebetween. As a result, stray capacity occurring in the conducting path that connects the excitation electrode and the IC terminal is made small, thereby preventing variations in oscillating frequency.

1 Claim, 4 Drawing Sheets

SURFACE MOUNT TYPE CRYSTAL OSCILLATOR

BACKGROUND OF THE INVENTION

1. Technical Field

The present invention relates to a surface mount type crystal oscillator (hereunder, referred to as a "surface mount oscillator") in which a crystal element and an IC chip are arranged in parallel, and in particular, to a surface mount oscillator in which the occurrence of stray capacity between an excitation electrode and a conducting path is suppressed.

2. Background of the Invention

A surface mount oscillator, because of its small size and light weight, is built-in as a source of frequency reference or time reference, particularly in portable electronic devices. For one such conventional example, a crystal piece and an IC chip are arranged within a container in parallel in the horizontal direction, and used for a thin electronic card including, for example, a SIM card (subscriber identity module card).

3. Prior Art

FIG. 3 is a drawing for describing a conventional example of a surface mount oscillator, wherein FIG. 3A is a plan view with cover removed, and FIG. 3B is a sectional view thereof.

As shown in FIG. 3, in the conventional surface mount oscillator, a crystal piece 2 and an IC chip 3 are housed within a sectionally concave-shaped container main body 1, and a metallic cover 4 is joined to an opening end surface 1c of the container main body 1 to thereby seal-enclose them therein. On this opening end surface 1c there is provided, for example, an annular metallic ring 5, and the metallic cover 4 is joined thereon by means of seam welding.

The container main body 1 comprises laminated ceramics 1a and 1b having a rectangular outer shape in plan view, and the four corner sections of an outer bottom surface 1d thereof have mount terminals 6 for a power supply terminal, an output terminal, a ground terminal, and a function terminal (for example, AFC terminal). Moreover, as necessary, on the external surface of the container main body 1 including the outer bottom surface 1d, there are provided communication terminals (not shown in the drawing) such as a crystal inspection terminal and a temperature compensation data writing terminal.

As shown in FIG. 3A, the crystal piece 2 is of a rectangular shape in plan view, excitation electrodes 7a and 7b are provided on the center area of both principle surfaces 2c and 2d thereof, and lead-out electrodes 8a and 8b extend out on both sides of one lengthwise end section of the crystal piece 2. Both sides of the one end section of the crystal piece 2 where the lead-out electrodes 8a and 8b extend out, are a corner section on one lengthwise side of the crystal piece 2 and a corner section on the other side. Here, each of the lead-out electrodes 8a and 8b respectively has a folded section 8c (refer to FIG. 4) that is folded toward the opposite surface of the principle surface of the crystal piece 2. Moreover, with the widthwise direction of the container main body 1 taken as the lengthwise direction of the crystal piece 2, the crystal piece 2 is arranged on an inner bottom surface 1e of the container main body 1. On this inner bottom surface 1e there are arranged crystal retention terminals 9a and 9b, and both sides of the one end section of the crystal piece 2 where the lead-out electrodes 8a and 8b extend out, are fixed to the crystal retention terminals 9a and 9b by means of electrically conductive adhesive agents 10a and 10b.

As shown in FIG. 3A, the IC chip 3 is of a rectangular shape in plan view. On this IC chip 3 is integrated an oscillating circuit (not shown in the drawing) and, as necessary, a temperature compensation mechanism, and one principle surface thereof serving as a circuit forming surface, has IC terminals 11. One side 3a of the IC chip 3 is made adjacent to and opposed to the one lengthwise side 2a of the crystal piece 2, and is fixed onto circuit terminals 12 provided on the inner bottom surface 1e of the container main body 1 by means of ultrasonic thermal bonding, for example, with use of bumps 15a and 15b (so-called flip-chip bonding). Thereby, the crystal piece 2 and the IC chip 3 are arranged in parallel in the horizontal direction and housed on the inner bottom surface 1e of the container main body 1.

Here, the crystal retention terminals 9a and 9b are connected, via conducting paths 13a and 13b, to circuit terminals 12a and 12b, onto which the crystal terminals 11a and 11b in the IC terminals 11 are joined by means of the bumps 15. Moreover, a power supply terminal, an output terminal, a ground terminal, and a function terminal in the IC terminals 11 are respectively connected electrically, via conducting paths (not shown in the drawing), to the aforementioned mount terminals 6 corresponding thereto. In this case, for example, from one end section of the IC chip corresponding to one end section of the crystal piece 2 where the lead-out electrodes 8a and 8b extend out, on one side of the IC chip 3 opposed to one side of the crystal piece 2, there are sequentially arranged the crystal terminals 11a and 11b of two of the IC terminals 11 of the IC chip 3. Thereby, the distance of the conducting paths 13a and 13b between the crystal retention terminals 9a and 9b and the crystal terminals 11a and 11b of the IC terminals 11, is reduced, and the wiring capacity thereof is made small. (refer to Japanese Unexamined Patent Publication No. H09-83248)

PROBLEM IN THE PRIOR ART

However, in the conventional surface mount oscillator having the above configuration, in order to reduce the distance of the conducting paths 13a and 13b between the crystal retention terminals 9a and 9b and the crystal terminals 11a and 11b of the IC terminals 11, the lead-out electrode 8a in the corner section on the one side of the crystal piece 2 adjacent to the IC chip 3 is connected to the one crystal terminal 11a in the corner section of the IC chip 3. Moreover the lead-out electrode 8b in the corner section on the other side 2b distanced from the IC chip 3 and opposed to the one side 2a of the crystal piece 2, needs to be connected, via the lower surface 2d of the crystal piece 2, to the other crystal terminal 11b arranged near the center of the IC chip 3.

Here, in a case where the lead-out electrode 8b that extends out from the excitation electrode 7b of the other principle surface (that is, the upper surface 2c of the crystal piece 2) opposed to the one principle surface (lower surface 2d) of the crystal piece 2 facing the inner bottom surface 1e of the container main body 1, is positioned in the corner section of the other side 2b opposed to the one side 2a of the crystal piece 2 adjacent to the IC chip 3, the conducting path 13b to be connected to the crystal terminal 11b arranged near the center of the IC chip 3, faces and is superimposed in plan view on the excitation electrode 7a of the one principle surface (lower surface 2d) of the crystal piece 2.

Therefore, there is a problem in that stray capacity occurs between the conducting path 13b electrically connected to the excitation electrode 7b of the other principle surface (upper surface) 2c of the crystal piece 2, and the excitation electrode 7a of the one principle surface (lower surface 2d), and variation in frequency consequently occurs.

FIG. 4 is a partly broken section view showing a state where the conducting path 13b electrically connected to the excitation electrode 7b of the other principle surface (upper surface 2c) of the crystal piece 2, and the excitation electrode 7a of the one principle surface (lower surface 2d), are superimposed in plan view facing each other.

Taking this into consideration, it may be considered to connect the conducting paths 13a and 13b that electrically connect the lead-out electrodes 8a and 8b on both sides of the one end section of the crystal piece 2 with the crystal terminals 11a and 11b of the IC terminals 11, via the outer circumference of the crystal piece 2, to the crystal terminals 11a and 11b, with neither of them being superimposed on the excitation electrodes 7 of the crystal piece 2. However, in this case there is a problem in that conducting paths (not shown in the drawing) that connect between the IC terminals 11 and the mount terminals 6 corresponding to the corner sections of the other side 2b of the crystal piece 2 and provided on the outer bottom surface 1d of the container main body 1, cross each other and consequently complicate the wiring patterns. Moreover, the area of the inner bottom surface 1e of the container main body 1 needs to be increased.

OBJECT OF THE INVENTION

An object of the present invention is to provide a surface mount oscillator in which the occurrence of stray capacity between conducting paths connecting excitation electrodes and IC terminals of a crystal piece is suppressed, thereby preventing variations in oscillating frequency.

SUMMARY OF THE INVENTION

The present invention is a surface mount crystal oscillator comprising: a rectangular crystal piece with lead-out electrodes extending out from excitation electrodes of both principle surfaces of the crystal piece to a corner section on one side which serves as one lengthwise end section, and to a corner section on the other side; an IC chip integrated with at least an oscillating circuit and that has IC terminals on one principle surface of a circuit function surface; and a container main body which houses the crystal piece and the IC chip, in which: one lengthwise side of the crystal piece and one side of the IC chip are arranged horizontally parallel on an inner bottom surface of the container main body while opposing each other; and the corner section on the one side serving as one end section of the crystal piece, from which the lead-out electrodes extend out, and the corner section on the other side, are electrically connected to and fixed to one crystal retention terminal of the inner bottom surface and to the other crystal retention terminal, and the IC terminals including crystal terminals sequentially arranged along the one side opposed to one side of the crystal piece from one end section of the IC chip corresponding to the one end section of the crystal piece, are electrically connected and fixed, by means of flip-chip bonding, to circuit terminals on the inner bottom surface, characterized in that: the lead-out electrode which extends out from the excitation electrode of the one principle surface of the crystal piece facing the inner bottom surface of the container main body, extends out to the corner section of the other side opposed to the one lengthwise side of the crystal piece, so as to be electrically connected to the other crystal retention terminal, and moreover, the other crystal retention terminal is electrically connected, via a conducting path superimposed on the excitation electrode of the one principle surface in plan view, to the other crystal terminal of the IC chip; and the lead-out electrode which extends out from the excitation electrode of the other principle surface opposed to the one principle surface of the crystal piece, extends out to the corner section of the one lengthwise side of the crystal piece opposed to the IC chip so as to be electrically connected to the one crystal retention terminal, and moreover, the one crystal retention terminal is electrically connected, via a conducting path not superimposed on the excitation electrode of the one principle surface in plan view, to the one crystal terminal of the IC chip.

EFFECT OF THE INVENTION

According to such a configuration, the lead-out electrode that extends out from the excitation electrode of the one principle surface (lower surface) of the crystal piece opposed to the inner bottom surface of the container main body, and that extends out to the corner section of the other side opposed to the one side of the crystal piece and adjacent to the IC chip, is connected, via a conducting path superimposed on the excitation electrode of the one principle surface (lower surface) of the crystal piece in plan view, to the other crystal terminal arranged closer, than the one crystal terminal, to the center. Therefore, the excitation electrode of the one principle surface of the crystal piece and the conducting path have the same electric potential, and stray capacity will not occur between the excitation electrode and the conducting path. As a result, it is possible to prevent variations in oscillating frequency.

BRIEF DESCRIPTION OF THE DRAWINGS

FIG. 1 is a drawing for describing one embodiment of embodiments [one embodiment] of a surface mount oscillator of the present invention, wherein

FIG. 3 is a drawing of a surface mount oscillator of a conventional example, wherein

DETAILED DESCRIPTION OF PREFERRED EMBODIMENT

Figure 1A:
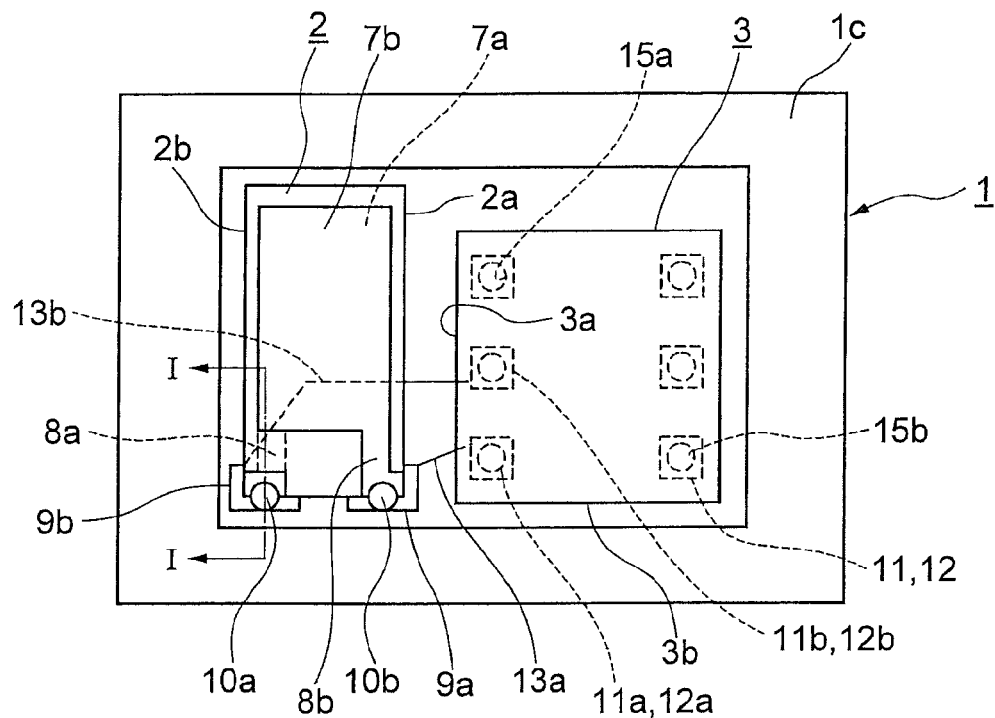
FIG. 1A is a plan view with cover removed.
Figure 1B:
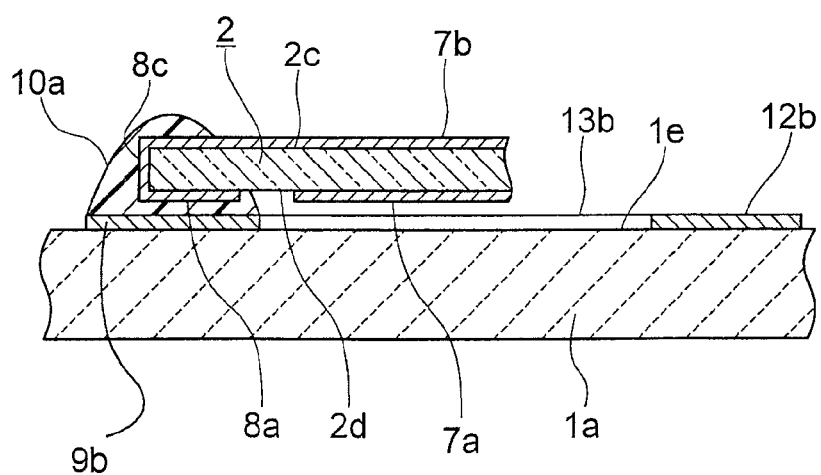
FIG. 1B is a partly broken sectional view taken along the line I-I in FIG. 1A.

FIG. 1 is a drawing for describing an embodiment of a surface mount oscillator of the present invention, wherein FIG. 1A is a plan view with cover removed, and FIG. 1B is a partly broken sectional view thereof.

Figure 3A:
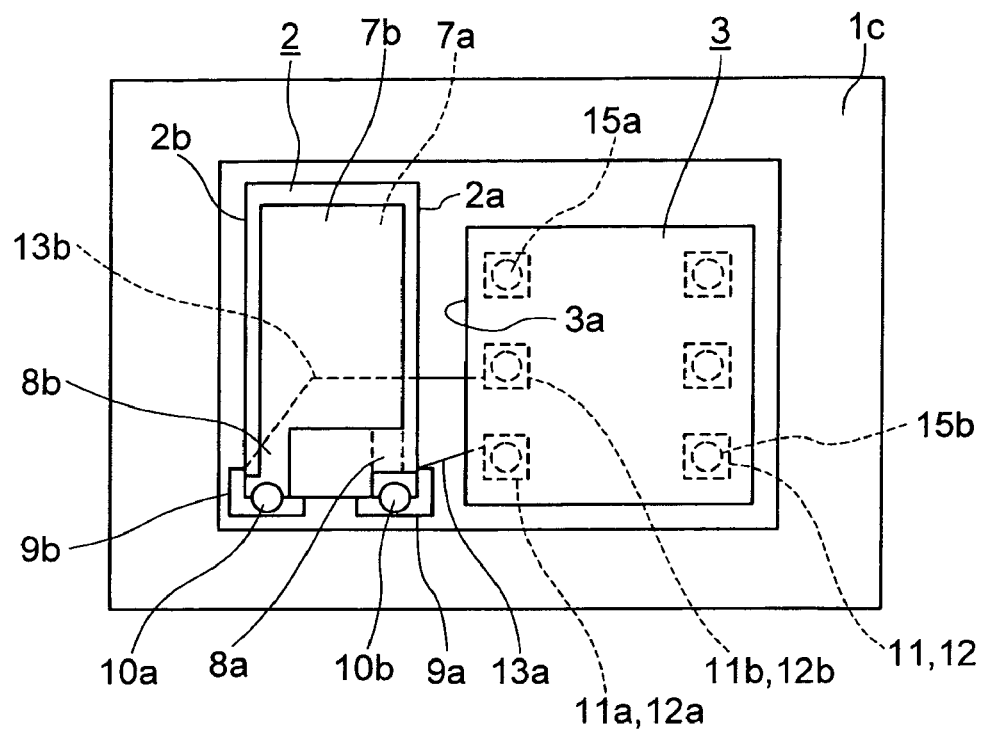
FIG. 3A is a plan view with cover removed.
Figure 3B:
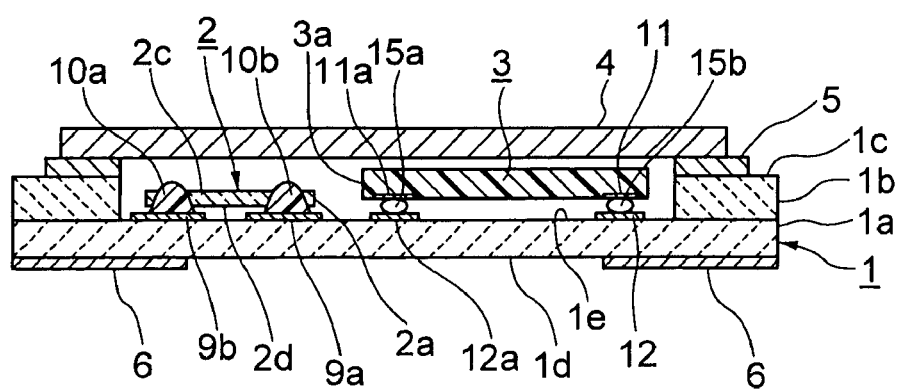
FIG. 3B is a sectional view thereof.
Figure 4:
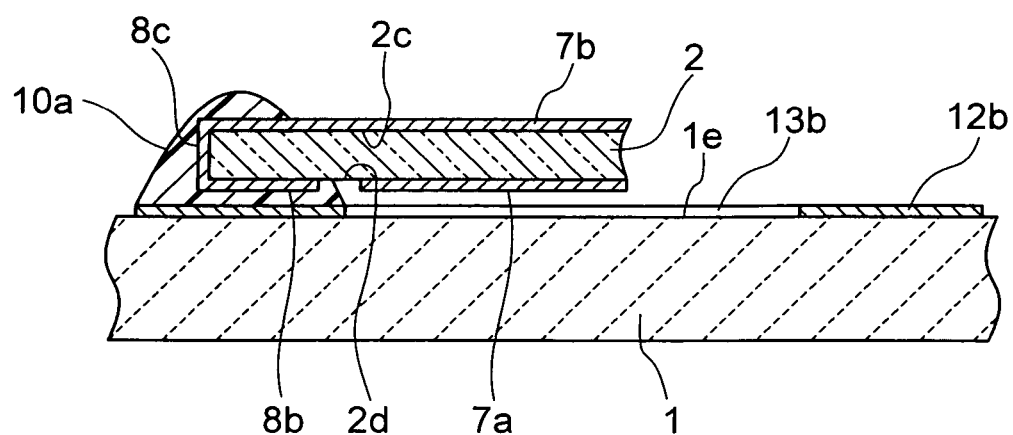
FIG. 4 is a sectional view for describing problems in the surface mount oscillator of the conventional example.

As described above (refer to FIG. 3), in the surface mount oscillator of the present invention, a crystal piece 2 and an IC chip 3 are housed within a sectionally concave-shaped container main body 1, and a metallic cover 4 is joined to an opening end surface 1c of the container main body 1 to thereby seal-enclose them therein. On this opening end surface 1c there is provided, for example, an annular metallic ring 5, and the metallic cover 4 is joined thereon by means of seam welding. The container main body 1 comprises laminated ceramics 1a and 1b having a rectangular outer shape in plan view, and the four corner sections of an outer bottom surface 1d thereof have mount terminals 6 for a power supply terminal, an output terminal, a ground terminal, and a function terminal (for example, AFC terminal). Moreover, as necessary, on the external surface of the container main body 1 including the outer bottom surface 1d, there are provided communication terminals (not shown in the drawing) such as a crystal inspection terminal and a temperature compensation data writing terminal.

Here, as shown in FIG. 1A and FIG. 1B, the crystal piece 2 and the IC chip 3, which are both in a rectangular shape in plan view, are fixed on an inner bottom surface 1e of the container main body 1 so as to be arranged in parallel in the horizontal direction. The crystal piece 2 is such that lead-out electrodes 8a and 8b extend out from excitation electrodes 7a and 7b provided on both principle surfaces 2c, 2d thereof, to a corner section on one side 2a, which is a lengthwise end section thereof, and to a corner section on the other side 2b. The crystal piece 2 is fixed, by means of electrically conductive adhesive agents 10a and 10b, on crystal retention terminals 9a and 9b provided on the inner bottom surface 1e of the container main body 1, and it is arranged so that the lengthwise direction of the crystal piece 2 is the widthwise direction of the container main body 1.

The IC chip 3 is configured with an oscillator circuit and a temperature compensation mechanism integrated therein, and a circuit forming surface (one principle surface) thereof has an IC terminal 11 thereon. Moreover, the IC terminal 11 is fixed on the circuit function surface by means of ultrasonic thermal compression bonding with use of bumps 15a and 15b (so-called flip-chip bonding), and one side 3a of the IC chip 3 is arranged so as to be opposed to and adjacent to the one lengthwise side 2a of the crystal piece 2. Crystal terminals 11a and 11b of the IC terminal 11 are sequentially arranged, along the one side 3a opposed to the one side 2a of the crystal piece 2, from one end section 3b of the IC chip 3 corresponding to one end section of the crystal piece 2.

Here, as shown in FIG. 1A, the lead-out electrode 8a extending out from the excitation electrode 7a of one principle surface (lower surface) 2d of the crystal piece 2 that opposes to the inner bottom surface 1e of the container main body 1, extends out to the corner section of the other side 2b opposed to the one lengthwise side 2a of the crystal piece 2, so as to be electrically connected to the other crystal retention terminal 9b. Moreover, the other crystal retention terminal 9b is electrically connected, by means of a conducting path 13b that is superimposed on the excitation electrode 7a provided on the one principle surface 2d of the crystal piece 2 in plan view, to the other crystal terminal 11b arranged near the center of the IC chip 3.

Furthermore, the lead-out electrode 8b extending out from the excitation electrode 7b that is provided on the other principle surface (upper surface) 2c opposed to the one principle surface (lower surface) 2d of the crystal piece 2, extends out to the corner section of the one lengthwise side 2a of the crystal piece 2 so as to be electrically connected to the one crystal retention terminal 9a. The one crystal retention terminal 9a is electrically connected, by means of a conducting path 13a that is not superimposed on the excitation electrode 7a of the one principle surface of the crystal piece 2 in plan view, to the one crystal terminal 11a on the one end section side of the IC chip 3.

The crystal piece 2 in the conventional example is such that the lead-out electrode 8a extends out from the excitation electrode 7a of the one principle surface (lower surface) 2d thereof to the right side of the one end section thereof in plan view, and the lead-out electrode 8b extends out from the excitation electrode 7b of the other principle surface (upper surface) 2c to the left side of the one end section thereof. On the other hand, in the present invention, the lead-out electrode 8a extends out from the excitation electrode 7a of the one principle surface (lower surface) 2d of the crystal piece 2 to the left side of the one end section thereof in plan view, and the lead-out electrode 8b extends out from the excitation electrode 7b of the other principle surface (upper surface) 2c of the crystal piece 2 to the right side of the one end section thereof. In short, in the present invention, the left-right positions of the lead-out electrodes 8a and 8b that extend out from the excitation electrodes 7a and 7b to the both sides of the one end section, are inversed from those in the conventional example.

According to such a configuration, the surface mount oscillator of the present invention is such that the excitation electrode 7a provided on the one principle surface (lower surface) 2d of the crystal piece 2 opposed to the inner bottom surface 1e of the container main body 1 is extended, and the lead-out electrode 8a that extends out to the corner section of the other side 2b on the opposite side of the one side 2a of the crystal piece 2 opposed to the IC chip 3, is connected to the crystal terminal 11b of the IC chip 3 by means of the conducting path 13b that is superimposed on the excitation electrode 7a of the one principle surface (lower surface) 2d of the crystal piece 2 in plan view. Therefore, the excitation electrode 7a provided on the one principle surface (lower surface) 2d, and the conducting path 13b have the same electric potential, and stray capacity will not occur between the excitation electrode 7a and the conducting path 13b. As a result, it is possible to prevent variation in oscillating frequency.

Figure 2:
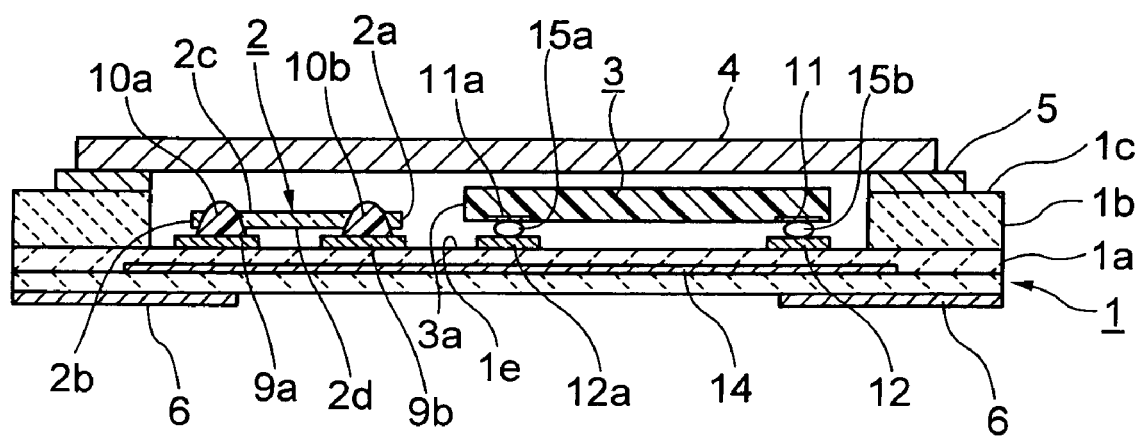
FIG. 2 is a sectional view for describing another embodiment of the surface mount oscillator of the present invention.

The bottom wall 1a of the container main body 1 has been illustrated as a single layer in the embodiment of the invention of the present application described above. However, as shown in FIG. 2 for example, there may be formed a ceramic package with the bottom wall 1a being multiple layers of ceramic plates, and a shield electrode 14 to be connected to the ground terminal of the mount terminal 6, may be formed between the laminated surfaces. The lead-out electrodes 8a and 8b provided on the crystal piece 2 both form a folded section 8c (refer to FIG. 1B) on the principle surface of the opposite surface of the crystal piece 2, and therefore the electrically conductive adhesive agents 10a and 10b may only be applied on the lower surface 2d of the crystal piece 2 based on the consistency in the height dimension of the crystal piece 2 and the IC chip 3. Moreover, changes may be made to the configuration as necessary.

What is claimed is:

1. A surface mount crystal oscillator comprising: a rectangular crystal piece with lead-out electrodes extending out from excitation electrodes of both principle surfaces of the crystal piece to a corner section on one side, which serves as one lengthwise end section, and to a corner section on the other side; an IC chip integrated with an oscillating circuit and that has IC terminals on one principle surface of a circuit function surface; and a container main body which houses said crystal piece and said IC chip, wherein:

one lengthwise side of said crystal piece and one side of said IC chip are arranged horizontally parallel on an inner bottom surface of said container main body while opposing each other; and the corner section on the one side serving as one end section of the crystal piece, from which said lead-out electrodes extend out, and the corner section on the other side, are electrically connected to and fixed to one crystal retention terminal of said inner bottom surface and to the other crystal retention terminal, and the IC terminals including crystal terminals sequentially arranged along the one side opposed to one side of said crystal piece from one end section of said IC chip corresponding to the one end section of said crystal piece, are electrically connected and fixed, by means of flip-chip bonding, to circuit terminals on said inner bottom surface, further comprising that the lead-out electrode which extends out from the excitation electrode of the one principle surface of said crystal piece facing the inner bottom surface of said container main body, extends out to the corner section of the other side opposed to said one lengthwise side of said crystal piece, so as to be electrically connected to said other crystal retention terminal, and moreover, said other crystal retention terminal is electrically connected, via a conducting path superimposed on the excitation electrode of said one principle surface in plan view, to one crystal terminal of said IC chip; and the lead-out electrode which extends out from the excitation electrode provided on the other principle surface opposed to the one principle surface of said crystal piece, extends out to the corner section of the one lengthwise side of said crystal piece opposed to said IC chip so as to be electrically connected to said one crystal retention terminal, and moreover, said one crystal retention terminal is electrically connected, via a conducting path not superimposed on the excitation electrode of said one principle surface in plan view, to the one crystal terminal of said IC chip.

* * * * *